United States Patent [19]
Rogers

[11] Patent Number: 5,371,425
[45] Date of Patent: Dec. 6, 1994

[54] DIGITAL DAMPING METHOD AND APPARATUS FOR PHASE-LOCKED LOOPS

[75] Inventor: Alan C. Rogers, Palo Alto, Calif.

[73] Assignee: Sun Microsystems, Inc., Mountain View, Calif.

[21] Appl. No.: 119,874

[22] Filed: Sep. 10, 1993

[51] Int. Cl.[5] .............................................. H03L 7/00
[52] U.S. Cl. ............................................ 327/3; 331/10; 331/17; 327/40; 327/113; 327/237
[58] Field of Search ............... 307/269, 525, 262, 510, 307/516; 330/277; 328/155; 331/17, 10

[56]           References Cited
        U.S. PATENT DOCUMENTS

| 5,012,494 | 4/1991 | Lai et al. | 331/17 |
| 5,126,692 | 6/1992 | Shearek et al. | 331/12 |
| 5,144,156 | 9/1992 | Kawasaki | 307/262 |
| 5,165,054 | 11/1992 | Platt et al. | 380/277 |

FOREIGN PATENT DOCUMENTS

2120478 11/1983 United Kingdom .................. 331/17

Primary Examiner—Timothy P. Callahan
Assistant Examiner—Dinh Le
Attorney, Agent, or Firm—Blakely Sokoloff Taylor & Zafman

[57]            ABSTRACT

A damping circuit is described which includes a phase-and-frequency detector, a charge pump, a voltage-current oscillator and a capacitor. The phase-and-frequency detector generates UP and DOWN signals representative of a difference in phase between a pair of digital input signals. The charge pump varies an amount of charge carried within the capacitor in accordance with the UP and DOWN signals. The voltage controlled oscillator generates an output signal having a frequency controlled by both a voltage provided by the capacitor and by the UP and DOWN signals directly received from the phase-and-frequency detector. No analog damping resistor is required. Rather, the digital damping circuit is a digital circuit which generates adequate phase and frequency damping without a damping resistor. In this manner damping is achieved which is substantially unaffected by process parameters and operating and ambient parameters. Method embodiments of the invention are also described.

34 Claims, 5 Drawing Sheets

DIGITAL DAMPING METHOD AND APPARATUS FOR PHASE-LOCKED LOOPS

BACKGROUND OF THE INVENTION

1. Field of the Invention

The invention generally relates to phase-lock bops (PLL) and in particular to digital phase-lock bops for use in connection with a microprocessor chip.

2. Description of Related Art

Digital PLL's are being increasingly employed in connection with microprocessor chips, in particular for maintaining and regenerating a clock signal used by the microprocessor chip. Initially, such PLL's were fabricated with components separate from the microprocessor chip with appropriate interconnection circuitry provided for operably connecting the off-chip PLL components to the microprocessor chip. Although an off-chip configuration has been successful for relatively low frequency microprocessor chips, such a configuration is not particularly effective for high frequency microprocessor chips, in part, due to noise occurring during transmission of signals between the microprocessor chip and the off-chip PLL components. Furthermore, a PLL having off-chip components incurs additional costs resulting from the fabrication and assembly of the off-chip components, as well as the provision of an extra pin for allowing communication between the microprocessor chip and the off-chip PLL components.

Figure 1:
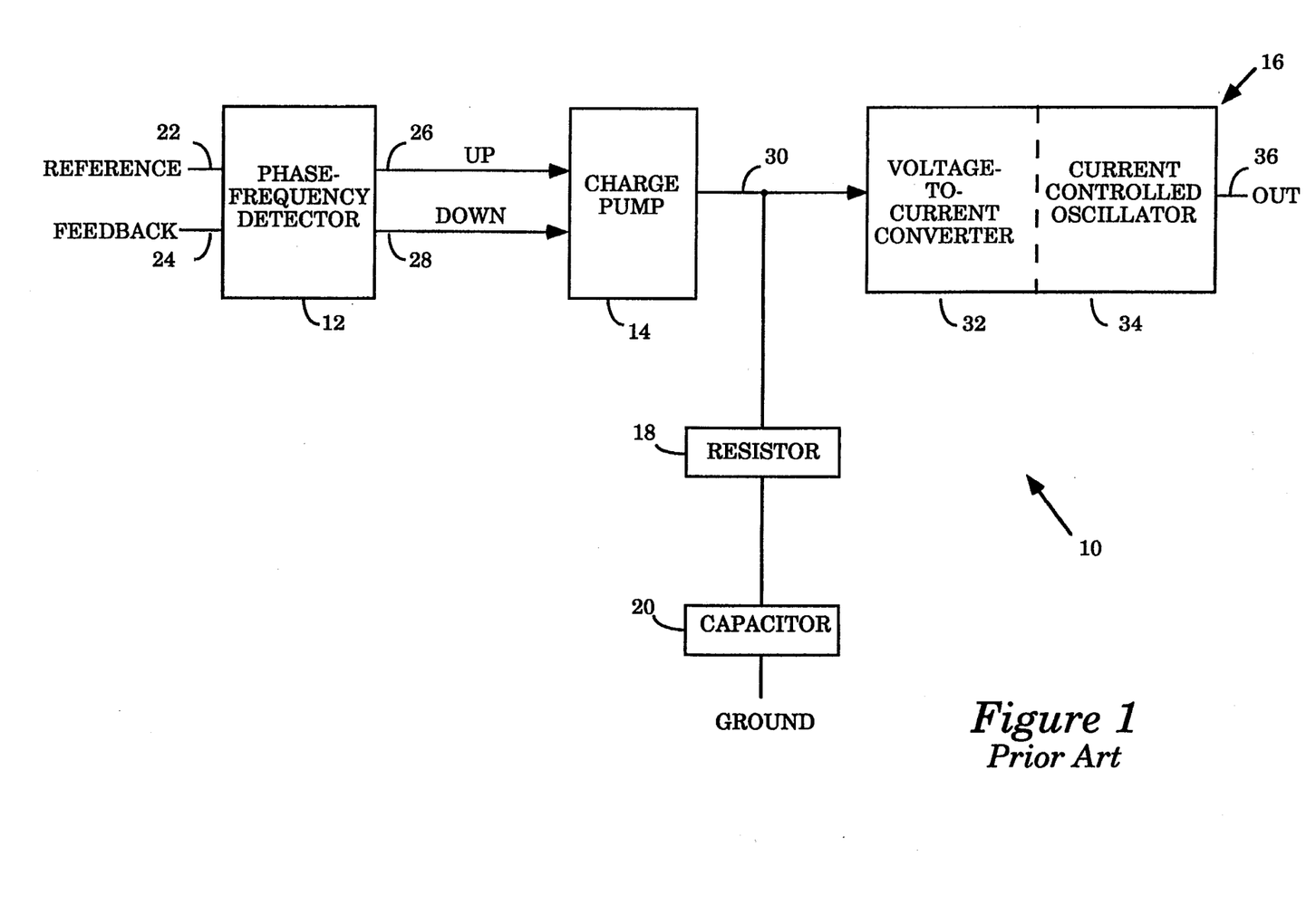
FIG. 1 is a block diagram representation of a prior art PLL damping circuit.

Accordingly, it is desirable to provide a complete PLL directly on a microprocessor chip, whereby the noise problem and extra costs described above are largely eliminated. FIG. 1 illustrates a portion of a PLL circuit appropriate for integrating within a microprocessor chip. For clarity and brevity the microprocessor chip itself is not illustrated in FIG. 1.

PLL circuit 10 of FIG. 1 includes a phase-and-frequency detector (PFD) 12, a charge pump (CP) 14, a voltage controlled oscillator (VCO) 16, a resistor 18 and a capacitor 20. PFD 12 receives a digital reference signal along an input line 22 and a digital feedback signal along an input line 24. PFD 12 is a digital circuit which generates signals representative of phase or timing differences between the feedback signal received along line 24 and the reference signal received along line 22. If the feedback signal has a phase later than that of the reference signal, PFD 12 outputs an UP signal along output line 26 which is representative of the amount of phase difference between the reference signal and that of the feedback signal. More specifically, the UP signal is a digital pulse having a length proportional to the phase difference between the feedback signal and the reference signal. If the feedback signal has a phase earlier than that of the reference signal, PFD 12 outputs a DOWN signal along an output line 28 which is representative of the amount by which the phase of the feedback signal differs from that of the reference signal. As with the UP signal, the DOWN signal is a signal pulse having a length proportional to the phase difference between the feedback signal and the reference signal. Thus, the UP signal represents the amount by which the feedback signal must be advanced relative to the reference signal whereas the DOWN signal represents the amount by which the feedback signal must be delayed relative to the reference signal.

CP 14 receives the UP and DOWN signals along lines 26 and 28 respectively. An output of the CP 14 is connected along a signal line 30 to an input of VCO 16 as well as into capacitor 20 through resistor 18. As can be seen from FIG. 1, resistor 18 and capacitor 20 are connected in series between a ground and signal line 30. Resistor 18 operates as a damping resistor for damping the overall frequency lock and for controlling the gain of the phase-lock of the PLL. CP 14 controls the amount of charge contained within capacitor 20 in response to the UP and DOWN signals received from PFD 12. More specifically, if the UP signal is active, CP 14 outputs current to capacitor 20 to increase the amount o: charge stored by capacitor 20. If the DOWN signal is active, CP 14 withdraws charge from capacitor 20 to decrease the amount of charge contained therein.

Hence, the amount of charge stored within capacitor 20 depends upon the historic or integrated difference between the feedback signal and the reference signal. A voltage sensed by VCO 16 likewise depends upon the difference between the frequency of the reference signal and the feedback signal because VCO 16 is electrically connected to capacitor 20 through resistor 18. VCO 16 includes two analog circuit components, a voltage-to-current circuit (VTCC) 32 and a current-controlled oscillator (CCO) 34. VTCC 32 generates a current signal proportional to a voltage carried on line 30. CCO 34 converts the current signal output by VTCC 32 into an output frequency signal for transmission along output signal line 36.

Although not shown in FIG. 1, output line 36 is connected through portions of the microprocessor chip in a feedback loop ultimately connected to feedback input line 24. The circuitry illustrated in FIG. 1 and the feedback loop (not shown) together provide the entire PLL. As can be appreciated, the output signal along line 36 has a frequency controlled by differences detected between the frequencies of the reference signal and the feedback signal. Output signal 36 may be connected to a clock signal line to regenerate a clock signal used for the synchronizing operation of the microprocessor chip.

The PLL circuit of FIG. 1 is fabricated according to conventional complementary metal oxide semiconductor (CMOS) technology. Hence, the size of capacitor 20 is restricted due to the limitations of CMOS capacitor fabrication. Because of the restriction in the size of the capacitor, the overall gain of the PLL illustrated in FIG. 1 is relatively high, requiring extremely high resistance values for damping resistor 18. As noted above, the damping resistor 18 operates to both damp the frequency lock and control the gain of the overall phase lock. As a result, mutually exclusive demands are imposed on the resistance value of resistor 18. The resistance value should be large to properly damp the frequency lock but must be relatively small to properly damp the phase lock. As can be appreciated, compromises must be made to accommodate the conflicting demands upon the resistor, resulting in a damping resistor which is only marginally effective in damping both the frequency lock and the phase lock.

Moreover, in most fabrication processes for fabricating a damping resistor on a microprocessor chip, the resistor is fabricated out of MOS transistors such that the resistance value of the resistor varies according to process and operating conditions. Hence, the resistance value cannot be precisely and repeatable defined. Furthermore, the phase gain of the PLL varies with operating frequency and conditions. As a result of these various restrictions and other factors, a typical on-chip PLL, such as illustrated in FIG. 1, provides inadequate damping for frequency lock. Further, the amount by which the PLL is under-damped varies from chip-to-chip as a result of processing and operating conditions. The various disadvantages are more significant for microprocessor chips operating at high frequencies.

SUMMARY OF THE INVENTION

From the foregoing, it can be appreciated that there is a need to provide an improved damping circuit for use directly on a microprocessor chip. One of the general objects of the invention is to provide such an improved damping circuit. A particular object of the invention is to provide an improved damping circuit for use in a on-chip digital PLL which provides adequate damping for frequency lock and which is generally unaffected by process and operating conditions.

These objects, and other general objects and advantages of the invention, are achieved by the provision of a damping circuit configured without a damping resistor, and instead provided with direct interconnection between a phase detection means and a damping means.

In accordance with one aspect of the invention, an improved damping circuit is provided which comprises:

a phase detection means, receiving first and second input signals, for generating first and second comparison output signals representative of differences between phases of the first and second input signals;

an integration means for summing the first and second comparison signals;

a voltage-to-current converter means, receiving a voltage signal from the integration means and receiving the first and second comparison signals from the phase detection means, for generating an output current representative of an amount of voltage provided by the integration means and further representative of the first and second comparison signals provided by the phase detection means; and a current-controlled oscillator means, connected to the voltage-to-current converter means, for generating a signal having a frequency representative of the output current of the voltage-to-current converter means.

Within a preferred embodiment, the integration means comprises: a capacitor means for storing a charge; and a charge pump means, connected to the phase detection means and the capacitor means, for varying an amount of charge stored on the capacitor means by an amount proportional to signals received from the phase detection means.

Also within the preferred embodiment, the voltage-to-current converter means includes:

a first n-MOS transistor having a gate connected to the capacitor means, a source connected to a ground, and a drain connected to an output line;

a second n-MOS transistor having a gate connected to the capacitor means, a source connected to the ground, and a drain;

a third n-MOS transistor having a gate connected to the first output of the phase detection means, a source connected to the drain of the second n-MOS transistor, and a drain connected to the output line;

a fourth n-MOS transistor having a gate connected to the capacitor means, a source connected to the ground, and a drain;

an inverter receiving the second comparison signal; and a fifth n-MOS transistor having a gate connected to an output of the inverter, a source connected to the drain of the fourth n-MOS transistor, and a drain connected to the output line.

In the preferred embodiment, the third and fifth n-MOS transistors each have a gain greater than a gain of each of the second and fourth n-MOS transistors. The second and fourth n-MOS transistors have substantially equal gain.

Although n-MOS transistors are preferred for some applications, other switching means may alternatively be employed. Also, the first and second signals are preferably digital. The damping circuit may be employed in a PLL or other circuitry such as a delay lock loop (DLL).

With the configuration of the preferred embodiment, adequate damping is achieved without requiring a damping resistor. Rather, damping is achieved by entirely digital means within the voltage-to-current converter means. Partially as a result of the elimination of the damping resistor, the limitations and restrictions described above with reference to FIG. 1 are avoided and adequate frequency-lock damping is achieved regardless of variations in process and operating conditions. In particular, a digital PLL constructed in accordance with the invention automatically adjusts a phase-gain of the PLL damping function to the particular operating conditions and to the frequency of the PLL. Moreover, the improved PLL circuit provides improved damping for frequency lock in a manner substantially unaffected by process variations. The PLL damping circuit can be totally digital and thereby not rely on, and not be affected by, analog qualities of individual analog components.

In accordance with another aspect of the invention a method is provided for achieving a phase-lock comprising the steps of:

receiving first and second input signals, having first and second frequencies respectively;

generating first and second comparison signals representative of differences between phases of the first and second input signals;

summing the first and second comparison signals;

generating a current signal in response to the sum of the first and second comparison signals and in response to the individual values of first and second comparison signals; and generating an output signal having a frequency proportional to said current signal.

In a preferred embodiment of the method, the first and second signals representative of a difference in frequency are generated by passing the input signals through a phase detector. The summing of the first and second comparison signals is achieved by varying an amount of charge on a capacitor in response to the comparison signals. The charge stored on the capacitor is varied by passing the first and second input signals through a charge pump connected to the capacitor. The current signal generated from a voltage of the capacitor and from the first and second comparison signals is achieved by passing the first and second comparison signals and the voltage signal through a voltage-to-current converter. The output signal is generated by passing the current signal through a current-controlled oscillator.

When embodied as either a method or an apparatus, the invention achieves adequate frequency lock damping as well as adequate phase lock damping in a manner substantially unaffected by operating conditions, processing conditions, operating frequencies and the like.

The digital damping system of the invention is ideally suited for use as an on-chip circuit for a microprocessor. However, the damping circuit and method may be employed in a variety of PLL applications including cellular telephones, car radios and metal detectors. In general, whenever a PLL is integrated onto a silicon chip, whether for low-cost or high-performance reasons, the PLL can benefit from application and principles of the invention. The invention is also applicable to non-PLL applications, such as DLL's and the like and may also be applicable to non-digital applications. Accordingly, the general and particular objects of the invention set forth above are achieved. Other objects and advantages of the invention will be apparent from the detailed description of the invention set forth below.

DETAILED DESCRIPTION OF THE INVENTION

Figure 2:
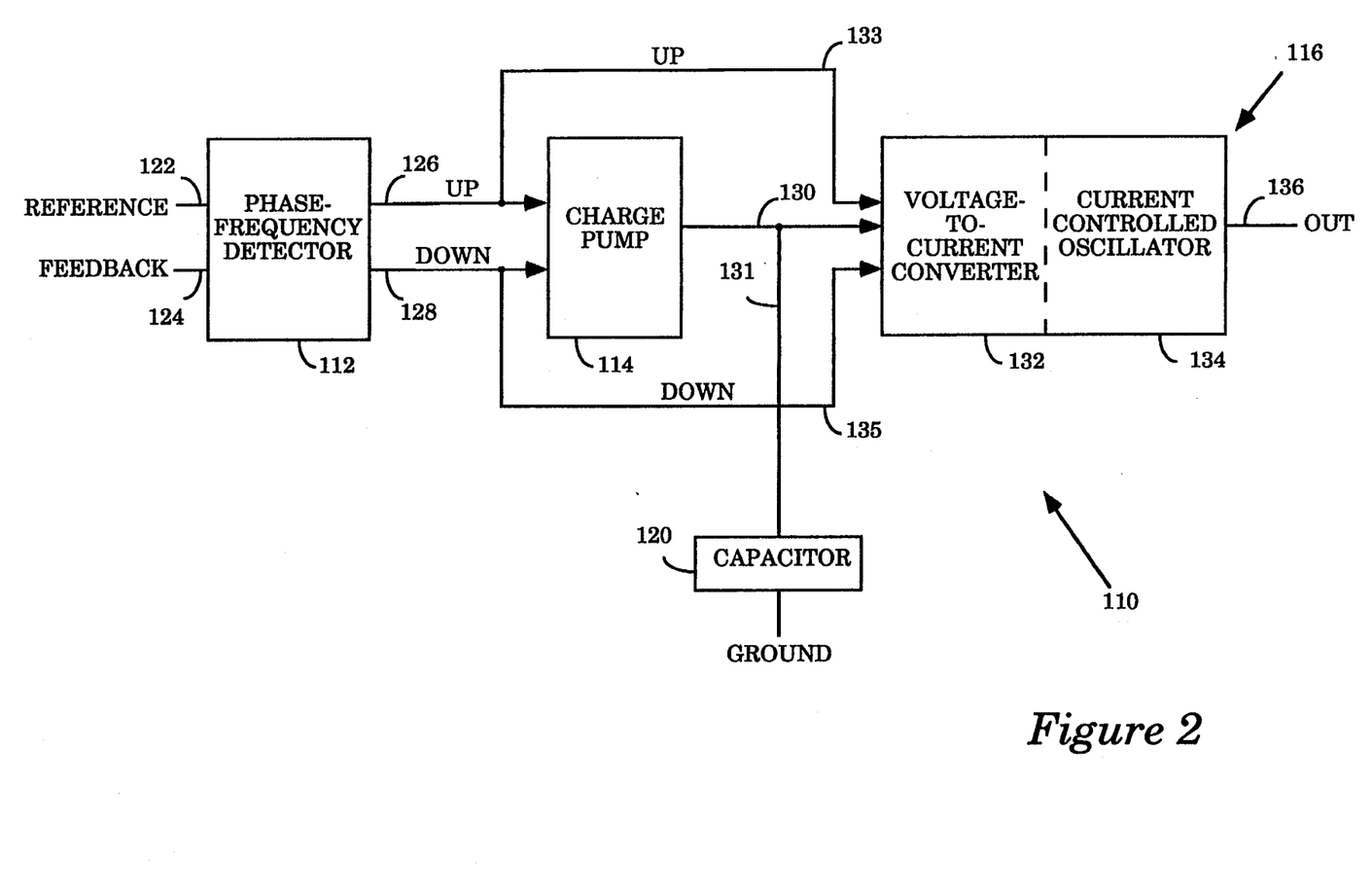
FIG. 2 provides a block diagram illustrating a digital PLL damping circuit configured in accordance with a preferred embodiment of the invention.

Referring to FIGS. 2-5, preferred and alternative embodiments of the invention will now be described. FIG. 2 illustrates a digital damping PLL circuit 110 for use on a microprocessor chip. Other components of the microprocessor chip are not shown in FIG. 2. Digital damping PLL circuit 110 includes a digital PFD 112, a CP 114, a VCO 116 and a capacitor 120. PFD 112 receives a reference signal along an input line 122 and a feedback signal (FB) along an input line 124. PFD 112 is a digital circuit which generates output comparison signals representative of differences between the phase or timings of the feedback signal and the reference signal. In particular, PFD 112 generates an UP signal output along line 126 and a DOWN signal output along line 128. More specifically, the UP signal is a digital pulse having a length proportional to the amount by which the phase of the feedback signal is later or less that of the reference signal. The DOWN signal is representative of an amount by which the phase of the feedback signal is earlier than or greater than that of the reference signal. As with the UP signal, the DOWN signal is a pulse having a pulse length proportional to any phase difference.

CP 114 is a charge pump circuit which varies an amount of charge stored on capacitor 120 in response to signals received from PFD 112 along lines 126 and 128. CP 114 provides output along a line 130. Capacitor 120 is connected to line 130 along a spur line 131. CP 114 operates to increase the amount of charge held by capacitor 120 if an UP signal is received and operates to decrease the amount of charge on capacitor 120 if a DOWN signal is received. The amount by which the charge is varied depends upon the length of the UP and DOWN signals. Capacitor 120 is also connected to a ground. As can be seen from a comparison of FIG. 1 and FIG. 2, the PLL digital damping circuit of FIG. 2 does not include a damping resistor such as the one illustrated in FIG. 1.

Together, charge pump 114 and capacitor 120 provide an integration or summation means for summing outputs of PFD 112 and for generating a voltage representative of that summation. Although the combination of a charge pump and a capacitor represents a preferred embodiment of the integration means, other integration or summation means may alternatively be employed. In general, any of a wide variety of devices which can sum the output signals of PFD 112 and generate a voltage in response thereto can be employed. One specific example of an alternative integration means is a digital integrator which employs a counter mechanism, an example of which is described in U.S. Pat. No. 5,220,293 to Rogers, which is incorporated by reference herein.

VCO 116 includes a VTCC 132 and a CCO 134. VTCC 132 receives a signal along line 130 having a voltage controlled by the amount of charge within capacitor 120. VTCC 132 also receives the UP and DOWN signals along lines 133 and 135, respectively, with line 133 providing a direct connection to line 126 and line 135 providing a direct connection to line 128. Thus, unlike the VCO of the PLL damping circuit of FIG. 1 which receives only a single input, VTCC 132 receives three input signals. VTCC 132 generates a current output signal which is responsive to both the voltage received along line 130 and any UP or DOWN pulse received along lines 133 and 135, respectively. CCO 134 generates an output signal having a frequency proportional to the current signal output from VTCC 132. (The particular configuration of VTCC 132 will be described in further detail below with reference to FIG. 3.) The output signal provided by CCO 134 is output along a line 136 which is connected to other components (not shown) on the microprocessor chip. In particular, the output signal may be used to regenerate a clock signal for controlling operation of components of the microprocessor chip. The remaining components of the microprocessor chip include a path through which the output signal is ultimately fed back onto input line 124, thereby providing a complete feedback loop. Hence, the components illustrated in FIG. 2, in combination with the feedback loop (not shown), together comprise a complete PLL circuit.

Figure 3:
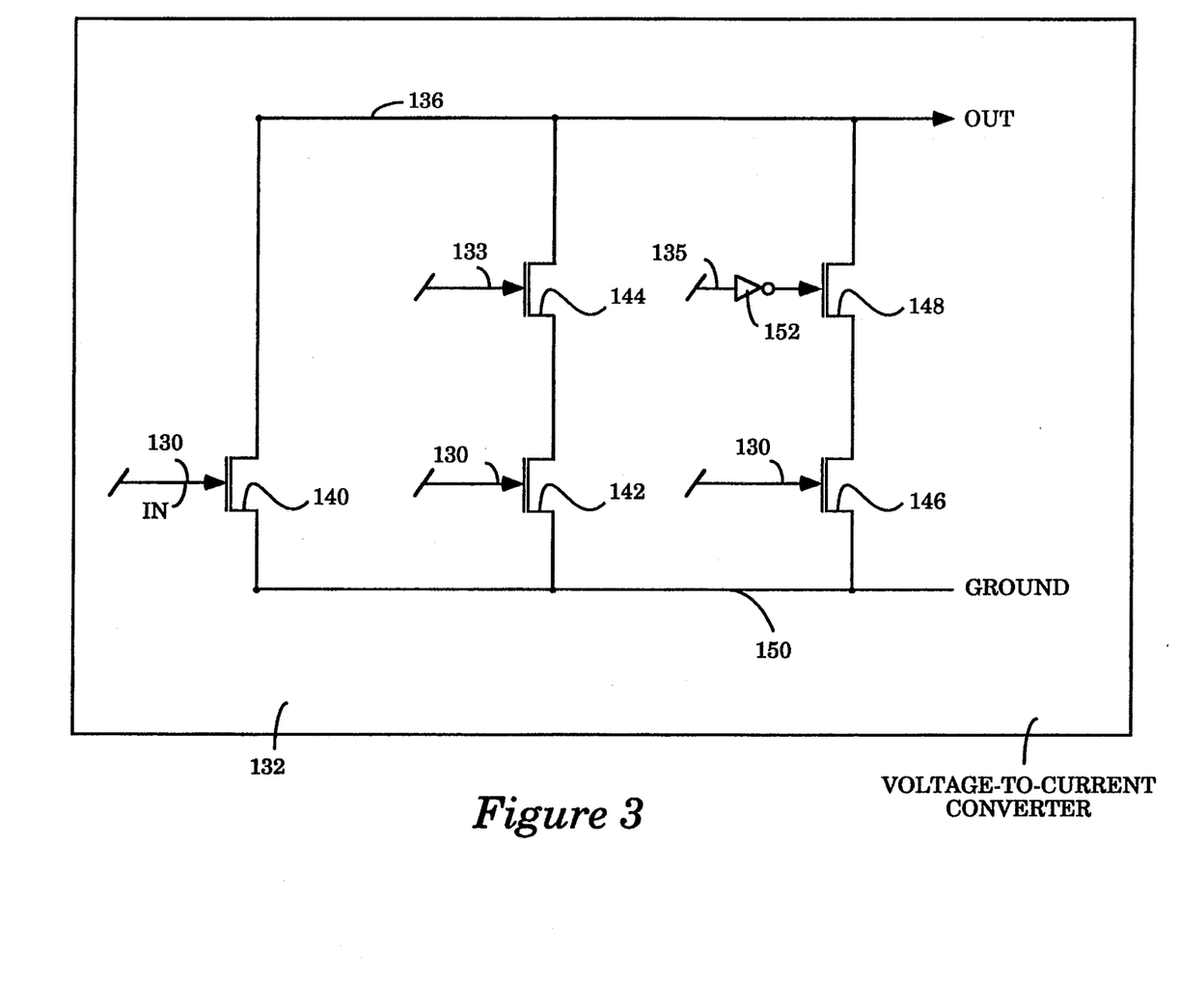
FIG. 3 provides a schematic illustration of a VTCC of the digital PLL damping circuit of FIG. 2.

FIG. 3 illustrates the internal architecture of the voltage-to-current architecture of VTCC 132. VTCC 132 includes five n-MOS transistors identified in FIG. 3 by reference numerals 140, 142, 144, 146 and 148. N-MOS transistor 140 has a gate connected to line 130, a source connected to a ground 150 and a drain connected to output line 136. Accordingly, n-MOS transistor 140 modulates a signal onto output line 136 which is representative of a voltage along line 130 which is, in turn, proportional to the amount of charge carried within capacitor 120 (FIG. 2).

N-MOS transistor 142 has a gate connected to input line 130 and a source connected to ground 150. N-MOS transistor 144 has a gate connected to signal line 133 for receiving the UP signal, a source connected to drain of n-MOS transistor 142 and a drain connected to output line 136. Accordingly, n-MOS transistor 142 and n-MOS transistor 144 together modulate a signal onto output line 136 which is controlled by both the voltage received along line 130 and the UP signal received along line 133.

N-MOS transistor 146 includes a gate connected to input line 130 and a source connected to ground 150.

N-MOS transistor 148 includes a source connected to a drain of n-MOS transistor 146. A gate of n-MOS transistor 148 is connected to an inverter 152 which is in turn connected to input line 135. A drain of n-MOS transistor 148 is connected to output line 136. The provision of inverter 152 insures that n-MOS transistor 148 receives an inverted DOWN signal. In this configuration, n-MOS transistors 146 and 148 together modulate a signal onto output line 136 which is controlled by the voltage along line 130 and the inverted DOWN signal.

Hence, three separate sets of transistors collectively operate to control the output signal along line 136 in response to the; amount of charge within capacitor 120 in response to UP and DOWN signals received from PFD 112 (FIG. 2).

N-MOS transistors 144 and 148 should preferably be equal to or larger than each of transistors 142 and 146. Transistors 142 and 146 are preferably, but not necessarily, of equal size. Preferably, transistors 140 and 146 together are equal in size to the n-MOS transistor of a conventional VTCC wherein, only a single n-MOS transistor is provided. Otherwise, the size of the various transistors illustrated in FIG. 3 may be selected, in accordance with well established circuitry considerations, to provide an output current having a desired relationship with the input values.

As will be appreciated by those skilled in the art, if transistors 142 and 146 have only ten percent of the gain of the combination of transistors 140 and 146, then the overall phase gain will be ten percent, regardless of process or ambient conditions, filter component values, loop gain, or operating frequency. Hence, the overall phase gain is unaffected by any of these various factors which, in general, substantially affect phase gain provided by the PLL damping circuit of FIG. 1 which includes an analog damping resistor. As such, adequate phase damping and adequate frequency damping are both achieved without the compromises necessitated by the configuration of FIG. 1.

Referring again to FIG. 2, the various components shown therein may be of substantially conventional design and fabrication other than VTCC 132. Of course, the particular design and fabrication, as well as the particular operational parameters, may be selected as needed, in accordance with well established circuit design principles, to achieve desired phase-lock loop parameters for use in particular applications.

Further, although a preferred embodiment of the invention employs n-MOS transistors to form VTCC 132, other general switching devices may be employed. For example, n-MOS transistors 144 and 148 illustrated in FIG. 3, may be any suitable type of switch, whereas n-MOS transistors 140, 142, and 146 may be any suitable type of voltage controlled current source. In general, VCO 116 may be implemented with a variety of alternative embodiments, including embodiments having resistor and bipolar and p-MOS components.

Figure 4:
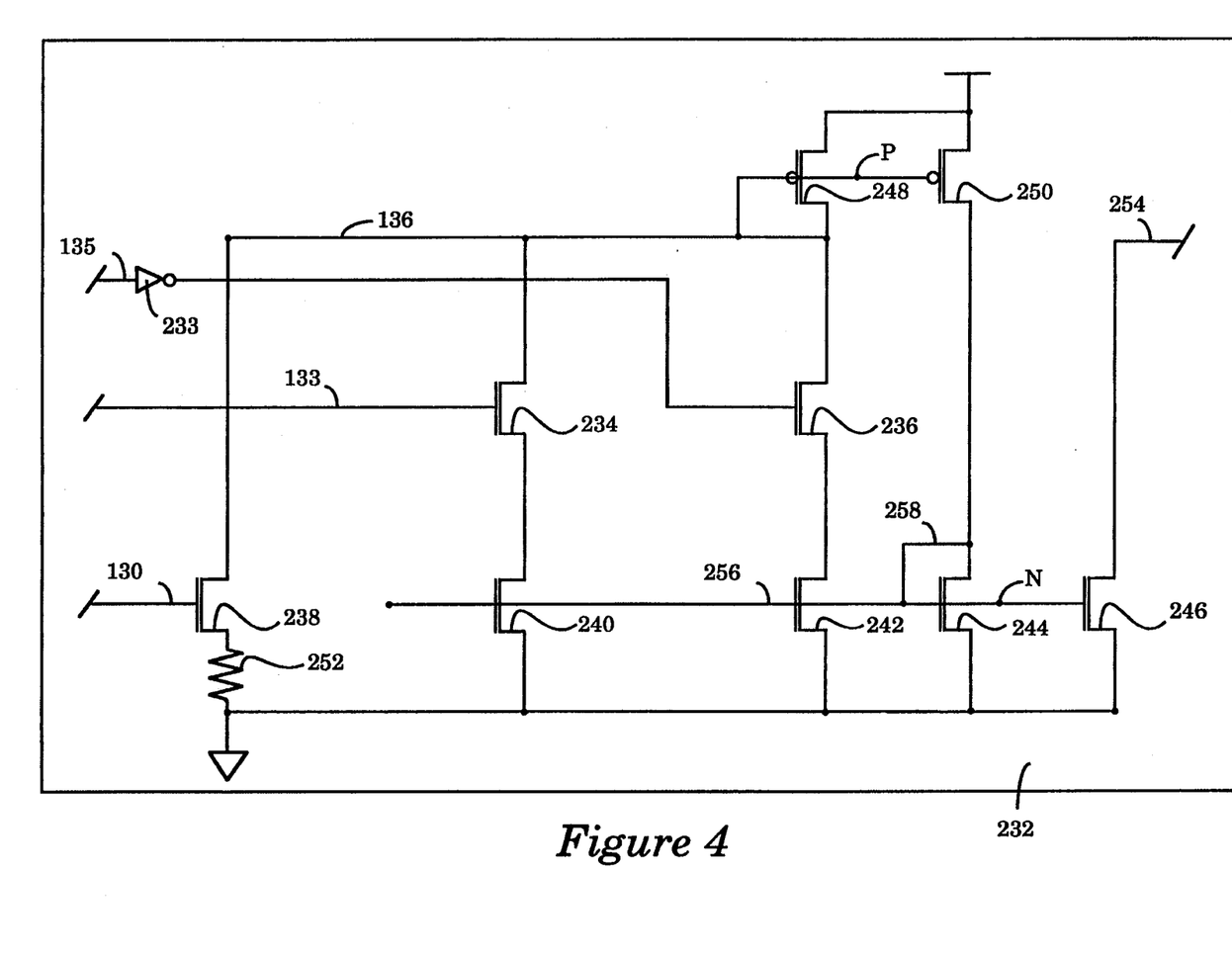
FIG. 4 provides a schematic illustration of an alternative embodiment of the VTCC of FIG. 3.

Referring to FIG. 4, an alternative embodiment to the VTCC is provided. The alternative embodiment of the VTCC is identified by reference numeral 232. VTCC 232 receives the DOWN signal along line 135, the UP signal along line 133 and the voltage signal along input line 130. Whereas the VTCC embodiment of FIG. 3 provides a total of five n-MOS transistors, the alternative embodiment of the VTCC includes a total of seven n-MOS transistors and a pair of p-MOS transistors. In FIG. 4, the n-MOS transistors are identified by reference numerals 234-246 and the p-MOS transistors are identified by reference numeral 248 and 250. The DOWN input signal received along; line 135 is inverted by inverter 233.

The inverted DOWN signal is transmitted to a gate of n-MOS transistor 236. The UP signal is received by a gate of n-MOS transistor 234. The input signal, received along line 130, is connected to a gate of n-MOS transistor 238. Drains of n-MOS transistors 234, 236 and 238 are all connected to both a gate and a drain of p-MOS transistor 248 and to the gate of p-MOS transistor 250. Sources of p-MOS transistor 248 and 250 are both connected to a high voltage source. A source of n-MOS transistor 238 is connected through a resistor 252 to a ground.

The remaining n-MOS transistors 240-246 are connected as follows. N-MOS transistor 240 is connected between the ground and a source of n-MOS transistor 234. N-MOS transistor 242 is connected between the ground and a source of n-MOS transistor 236. N-MOS transistor 244 is connected between the ground and a drain of p-MOS transistor 250. Finally, n-MOS transistor 246 is connected between the ground and an output line 254. Gates of n-MOS transistors 240-246 are all interconnected via line 256. An additional line 258 connects line 256 to the drain of p-MOS transistor 250.

Exemplary sizes for the various transistors, provided as channel width/channel length ratios, is set forth in Table I.

TABLE I

| | |
|---|---|
| n-MOS transistor 234 | 2/0.8 |
| n-MOS transistor 236 | 2/0.8 |
| n-MOS transistor 238 | 10/0.8 |
| n-MOS transistor 240 | 2/0.8 |
| n-MOS transistor 242 | 2/0.8 |
| n-MOS transistor 244 | 10/0.8 |
| n-MOS transistor 246 | 10/0.8 |
| p-MOS transistor 248 | 20/0.8 |
| p-MOS transistor 250 | 20/0.8 |

Although Table I provides a set of exemplary sizes for the various transistors for FIG. 4, other suitable choices for the sizes of the transistors may be selected in accordance with particular applications. As such, the values of Table I should be regarded as exemplary or illustrative.

The embodiment of the VTCC of FIG. 4 is particularly useful in a digital damping circuit wherein a resistor is employed for precise voltage-to-current conversion. As a practical matter, nodes P and N of FIG. 4, may be used as a current-mirror control for VCO 134 (FIG. 2). In such an implementation, transistor 246 and output line 254 are not required. Rather, outputs are drawn directly from the P and N nodes and transmitted by lines (not shown) to the VCO.

Figure 5:
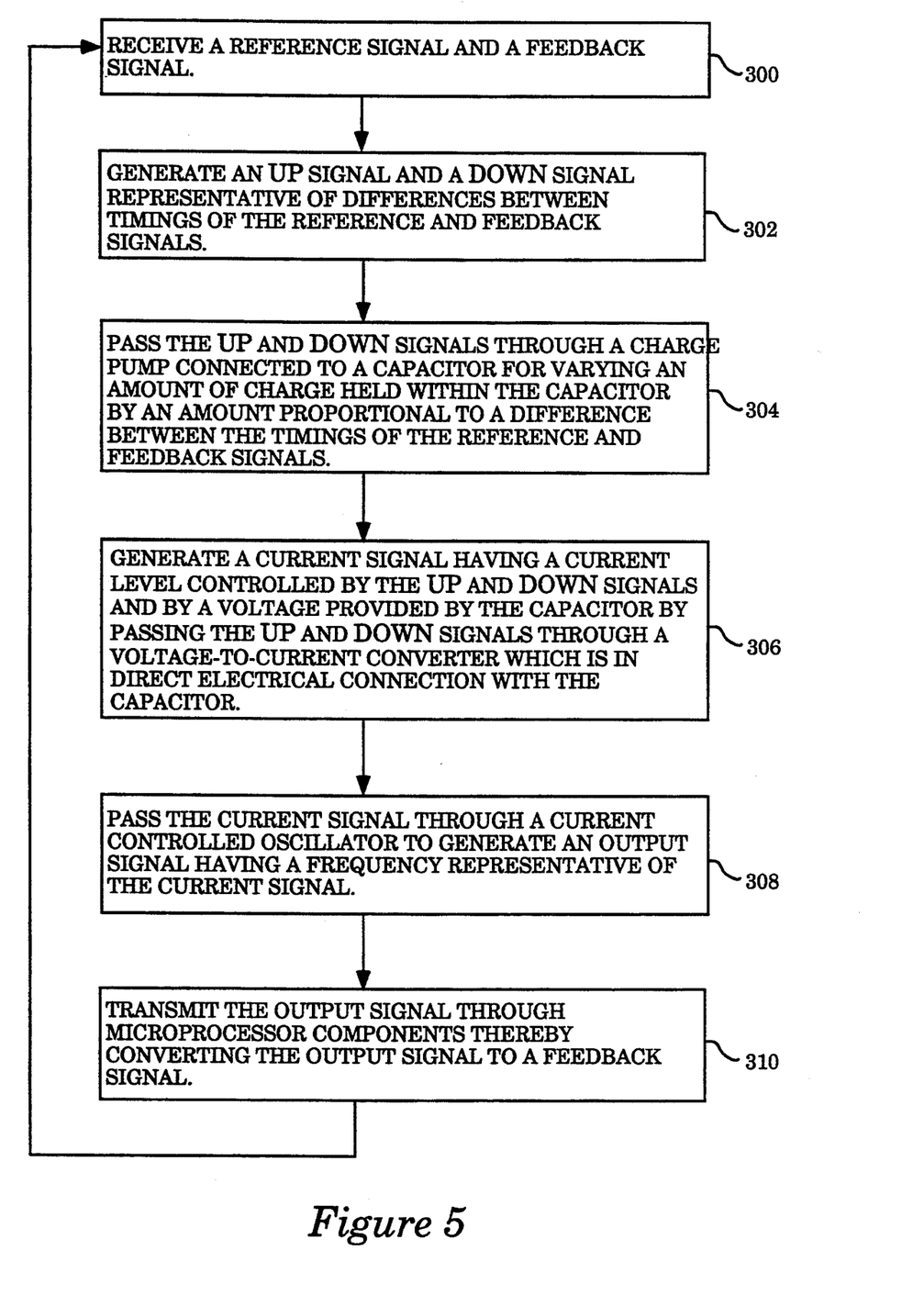
FIG. 5 is a flow chart illustrating a digital PLL damping method in accordance with a preferred embodiment of the invention.

Referring to FIG. 5, a method of digital phase-lock-loop damping will now be described. The method of FIG. 5 may be employed in connection with a circuit as configured in FIGS. 2-4. However, the method may be employed in other circumstances and in connection with other circuitry, as well. Initially, at step 300, first and second input signals are received with the first signal providing a reference signal and the second signal providing a feedback signal. The timing of the reference signal may differ from the timing of the feedback signal. At 302, the reference signal and the feedback signal are transmitted through a phase-and-frequency detector which generates a pair of comparison signals representative of differences between phase of the input reference and feedback signals. A first of the pair of the comparison signals is representative of an amount by which the phase of the reference signal exceeds the feedback signal. The second of the pair of comparison signals is representative of an amount by which the phase of the feedback signal exceeds that of the reference signal. The pair of comparison signals are preferably digital signals having pulse lengths proportional to the phase differences between the reference and feedback signals. The first and second comparison signals are alternatively referred to herein as UP and DOWN signals. At 304, a charge held within a capacitor is varied relative to a difference between the frequencies of the input signals. This step may be achieved by passing the UP and DOWN signals through a charge pump which controls an amount of charge carried on a capacitor in response to the UP and DOWN signals. At 306, a current signal is generated, which has a current level controlled by a voltage provided by the capacitor and by the first and second comparison signals. The current signal may be generated by passing the first and second comparison signals through a voltage-to-current converter which is also in direct electrical connection with the capacitor.

A suitable voltage-to-current converter is illustrated in FIG. 3 and described above. When employed using the circuit of FIG. 3, step 306 may be regarded as including the substeps of transmitting the first comparison signal into a gate of n-MOS transistor 144, transmitting the second comparison signal into inverter 152 and transmitting the voltage signal from the capacitor into the gates of transistors 140, 142 and 146.

At step 308, an output signal is generated having a frequency representative of the current signal generated at step 306. Step 308 may be performed by passing the output of step 306 through a current-controlled oscillator. At step 310, the output signal is transmitted through on-chip components of the microprocessor to convert the output signal to a feedback signal for re-inputting at step 300.

What has been described is a digital damping PLL method and apparatus which may be employed on or in conjunction with a microprocessor chip. Although the PLL damping circuit of the invention is advantageously employed as an on-chip component of any chip requiring a PLL, the advantages of the invention are best exploited within microprocessor chips having very high operational frequencies. As discussed above, one possible advantage of the improved method and apparatus is that adequate phase damping and frequency damping may be achieved regardless of various process, operational, and frequency parameters. However, application of principles of the invention are not solely limited to achieving these advantages, and other advantages may be achieved by exploiting principles of the invention. Furthermore, although described with respect to exemplary embodiments, these embodiments are merely illustrative of the invention and do not limit the scope of the invention. In particular, principles of the invention may be applied to non-PLL applications, such as DLL's. In general, principles of the invention can be advantageously applied to a variety of applications requiring digital phase damping, and may be applicable to non-digital damping applications as well.

What is claimed is:

1. A damping circuit comprising:
   a phase detection means, receiving a first signal at a first frequency and a second signal at a second frequency, for generating a first comparison signal representative of an amount by which a phase of the first signal exceeds a phase of the second signal and for generating a second comparison signal representative of an amount by which the phase of the second signal exceeds the phase of the first signal;
   integration means for summing said first and second comparison signals, said integration means providing an output voltage representative of the sum of said comparison signals;
   a voltage-to-current converter means, having first, second and third inputs, said first and third inputs receiving said first and second comparison signals from said phase detection means, said second input receiving said output voltage from said integration means, for generating an output current, along an output line, representative of an amount of voltage provided by said integration means and further representative of the first and second comparison signals provided by said phase detection means; and
   a current-controlled oscillator means, connected to said voltage-to-current converter means, for generating an output signal having a frequency representative of the output current of the voltage-to-current converter means.

2. The damping circuit of claim 1, wherein said first and second input signals are digital.

3. The damping circuit of claim 1, wherein said integration means comprises:
   capacitor means for storing a charge, said capacitor means connected to a ground; and
   a charge pump means, having first and second inputs receiving said first and second comparison signals from said phase detection means, and having an output connected to said capacitor means, for varying the amount of charge stored in the capacitor means by an amount proportional to the comparison signals received.

4. The damping circuit of claim 1, wherein said voltage-to-current converter means comprises:
   a first voltage controlled current source having a control line connected to an output of said integration means, an input connected to ground and an output connected to said output line of said voltage-to-current converter means;
   a second voltage controlled current source having a control line connected to said output of said integration means, an input connected to said ground and an output;
   a first switch having a control line receiving said first comparison signal from said phase detection means, an input connected to the output of said second voltage controlled current source, and an output connected to said output line of said voltage-to-current converter means;
   a third voltage controlled current source having a control line connected to said output of said integration means, an input connected to said ground, and an output;
   an inverter receiving said second comparison signal; and
   a second switch having a control line connected to an output of said inverter, an input connected to said output of said third voltage controlled current source and an output connected to said output line.

5. The damping circuit of claim 3, wherein said voltage-to-current converter means comprises:
 a first n-MOS transistor having a gate connected to said capacitor means, a source connected to ground and a drain connected to said output line of said voltage-to-current converter means;
 a second n-MOS transistor having a gate connected to said capacitor means, a source connected to said ground and a drain;
 a third n-MOS transistor having a gate connected to said first output of said phase-and frequency detector, a source connected to the drain of said second n-MOS transistor and a drain connected to said output line of said voltage-to-current converter means;
 a fourth n-MOS transistor having a gate connected to said capacitor means, a source connected to said ground and a drain;
 an inverter receiving said second comparison signals; and
 a fifth n-MOS transistor having a gate connected to an output of said inverter, a source connected to said drain of said fourth transistor, and a drain connected to said output line of said voltage-to-current converter means.

6. The damping circuit of claim 5, wherein said third and fifth n-MOS transistors each have a gain greater than a gain of each of said second and fourth n-MOS transistors.

7. The damping circuit of claim 6, wherein said second and fourth n-MOS transistors have substantially equal gain.

8. The damping circuit of claim 1, wherein said first comparison signal output from said phase detection means is a pulse having a length representative of the amount by which the phase of the first input signal received by the phase detection means exceeds the phase of the second input signal received by the phase detection means and wherein said second comparison signal is a pulse having a length representative of the amount by which the phase of the second input signal exceeds the phase of the first input signal.

9. The damping circuit of claim 8, wherein, while said first comparison signal from said phase detection means is active, said charge pump means adds charge to said capacitor means by an amount proportional to the length of the first comparison signal and, while said second comparison signal from said phase detection means is active, said charge pump means withdraws charge from said capacitor means by an amount proportional to the length of the second comparison signal.

10. The damping circuit of claim 3, wherein said signal output by said charge pump means is an electrical signal providing an electrical charge representative of a combination of the first and second comparison signals received by the charge pump means.

11. The damping circuit of claim 1, wherein said first signal is a reference signal and said second signal is a feedback signal.

12. A damping circuit comprising:
 a phase detector, receiving a first signal at a first frequency and a second signal at a second frequency, for generating a first comparison signal representative of an amount by which a phase of the first signal exceeds a phase of the second signal and for generating a second comparison signal representative of an amount by which the phase of the second signal exceeds the phase of the first signal;
 an integrator receiving said first and second comparison signals, said integrator generating an output signal having a voltage representative of a summation of said signals;
 a voltage-to-current converter having first, second and third inputs, said first and third inputs receiving said first and second comparison signals, said second input receiving signals from said output of said integrator; and
 a current-controlled oscillator connected to an output line said voltage-to-current converter.

13. The damping circuit of claim 12, wherein said signal output by said integrator is an electrical signal providing an electrical charge representative of a combination of the first and second comparison signals received by the integrator.

14. The damping circuit of claim 12, wherein said integrator comprises:
 a charge pump having first and second inputs receiving said first and second comparison signals, and having an output; and
 a capacitor connected between said output of said charge pump and a ground.

15. The damping circuit of claim 14, wherein said voltage-to-current converter means comprises:
 a first voltage controlled current source having a control line connected to said capacitor, an input connected to ground and an output connected to said output line of said voltage-to-control converter;
 a second voltage controlled current source having a control line connected to said capacitor, an input connected to said ground and an output;
 a first switch having a control line connected to said first output of said phase detector, an input connected to the output of said second switch, and an output connected to said output line of said voltage-to-current converter;
 a third voltage control led current source having a control line connected to said capacitor, an input connected to said ground, and an output;
 an inverter receiving said second comparison signal; and
 a second switch having a control line connected to an output of said inverter, an input connected to said output of said third voltage controlled current source and an output connected to said output line of said voltage-to-current converter.

16. The damping circuit of claim 14, wherein said voltage-to-current converter comprises:
 a first n-MOS transistor having a gate connected to said capacitor, a source connected to ground and a drain connected to said output line of said voltage-to-current converter;
 a second n-MOS transistor having a gate connected to said capacitor, a source connected to said ground and a drain;
 a third n-MOS transistor having a gate connected to said first output of said phase detector, a source connected to the drain of said second n-MOS transistor and a drain connected to said output line;
 a fourth n-MOS transistor having a gate connected to said capacitor, a source connected to said ground and drain;
 an inverter receiving said second comparison signals; and a fifth n-MOS transistor having a gate connected to an output of said inverter, a source connected to said drain of said fourth transistor, and a drain connected to said output line of said voltage-to-current converter.

17. The damping circuit of claim 16, wherein said third and fifth n-MOS transistors each have a Fain greater than a gain of each of said second and fourth n-MOS transistors.

18. The damping circuit of claim 17, wherein said second and fourth n-MOS transistors have substantially equal gain.

19. The damping circuit of claim 14, wherein said first comparison signal output from said phase detector is a pulse having a length representative of an amount by which the phase of the first input signal received by the phase detector exceeds the phase of the second input signal received by the phase detector and with said second comparison signal is a pulse having a length representative of an amount by which the phase of the second input signal exceeds the phase of the first input signal.

20. The damping circuit of claim 19, wherein, while said first comparison signal from of said phase detector is active, said charge pump adds charge to said capacitor by an amount proportional to the length of the first comparison signal and, while said second output signal of said phase detector is active, said charge pump withdraws charge from said capacitor by an amount proportional to the length of the second comparison signal.

21. The damping circuit of claim 14, wherein said signal output by said charge pump is an electrical signal having an electrical charge representative of a combination of the first and second comparison signals received by the charge pump.

22. The damping circuit of claim 12, wherein said first input signal is a reference signal and said second input signal is a feedback signal.

23. A damping circuit for use on a microprocessor chip, said damping circuit comprising:
a phase detector, receiving a first signal at a first frequency and a second signal at a second frequency, for generating a first comparison signal representative of an amount by which a phase of the first signal exceeds a phase of the second signal and for generating a second comparison signal representative of an amount by which the phase of the second signal exceeds the phase of the first signal;
a charge pump, having first and second inputs receiving said first and second comparison signals from said phase detector, said charge pump having an output;
a capacitor connected between said output of said charge pump and a ground;
a first n-MOS transistor having a gate connected to said capacitor, a source connected to ground and a drain connected to an output line;
a second n-MOS transistor having a gate connected to said capacitor, a source connected to said ground a drain;
a third n-MOS transistor having a gate connected to said first output of said phase-and frequency detector, a source connected to the drain of said second n-MOS transistor and a drain connected to said output line;

a fourth n-MOS transistor having a gate connected to said capacitor, a source connected to said ground and a drain;
an inverter receiving said second comparison signal;
a fifth n-MOS transistor having a gate connected to an output of said inverter, a source connected to said drain of said fourth transistor, and a drain connected to said output line; and
a current-controlled oscillator connected to said output line of said voltage-to-current converter.

24. A digital damping method for generating an output signal from a pair of input signals, said method comprising:
generating a pair of comparison signals representative of differences between phases of the input signals, with a first of said pair of comparison signals being representative of an amount by which a phase of the first input signal exceeds that of the second input signal, and with a second of said pair of comparison signals being representative of an amount by which a phase of the second input signal exceeds that of the first input signal;
varying a charge held within a charge storage device relative to a difference between the phases of the; input signals based on the comparison signals;
generating a current signal having a current controlled by a voltage provided by said charge storage device and by said first and second comparison signals; and
generating an output signal having a frequency representative of the current of the current signal.

25. A method for processing a pair of input signals to generate an output signal comprising the steps of:
receiving a first input signal at a first frequency and a second input signal at a second frequency;
generating a first comparison signal representative of an amount by which a phase of the first input signal exceeds a phase of the second input signal and generating a second comparison signal representative of an amount by which a phase of the second signal exceeds the phase of the first input signal;
summing said first and second comparison signals;
generating a current signal representative of the first and second comparison signals and further representative of the sum of the first and second comparison signals; and
generating an output signal having a frequency representative of the current signal.

26. The method of claim 25, wherein said step of summing said first and second signals comprises the steps of:
storing a charge in a capacitor; and
varying the amount of charge stored in the capacitor by an amount proportional to the comparison signals.

27. The method of claim 25, wherein said step of generating the first and second comparison signals comprises the steps of:
generating a first pulse having a length representative of the amount by which the phase of the first input signal exceeds the phase of the second input signal; and
generating a second pulse having a length representative of the amount by which the phase of the second input signal exceeds the phase of the first input signal.

28. The method of claim 27, wherein said step of generating said comparison pulses further comprises the steps of passing said input signals through a phase detector.

29. The method of claim 26, wherein said step of controlling said charge within said capacitor comprises the step of passing said first and second comparison signals through a charge pump operably connected to said capacitor, said charge pump increasing said charge in response to said first comparison signal and decreasing said charge in response to said second comparison signal.

30. The method of claim 26, wherein said step of generating a current signal representative of an amount of voltage provided by said capacitor and further representative of the first and second comparison signals comprises the step of
passing said first and second comparison signals and a voltage signal representative of a voltage on said capacitor through a voltage-to-current converter.

31. The method of claim 25, wherein said step of generating an output signal having a frequency representative of the current signal comprises the step of:
passing said current signal through a current-controlled oscillator.

32. The method of claim 30, wherein said voltage-to-current converter includes
a first n-MOS transistor having a gate connected to an output of said charge pump, a source connected to ground and a drain connected to an output line;
a second n-MOS transistor having a gate connected to said output of said charge pump, a source connected to said ground a drain;
a third n-MOS transistor having a gate connected to said first output of said phase-and frequency detector, a source connected to the drain of said second n-MOS transistor and a drain connected to said output line;
a fourth n-MOS transistor having a gate connected to said output of said charge pump, a source connected to said ground and a drain;
an inverter receiving said second comparison signal; and
a fifth n-MOS transistor having a gate connected to an output of said inverter, a source connected to said drain of said fourth transistor, and a drain connected to said output line; and
wherein said step of passing said first and second comparison signals and said voltage signal through said voltage-to-current converter comprises the steps of:
transmitting said first comparison signal into said gate of said third transistor;
transmitting said second comparison signal into said inverter; and
transmitting said voltage signal into said gates of said first, second and fourth transistors.

33. A damping circuit comprising:
a phase detection means, receiving first and second input signals and generating a first comparison signal representative of an amount by which a phase of the first signal exceeds a phase of the second input signal and a second comparison signal representative of an amount by which the phase of the second input signal exceeds the phase of the second input signal;
an integration means for combining said first and second comparison signals and for generating a third comparison signal representative of a sum of said first and second comparison signals; and
damping means, receiving said first, second and third comparison signals, for generating an output signal having a phase between the phases of the first and second output signals.

34. In a damping device having a phase detector generating first and second comparison signals based on phase differences between a pair of digital input signals, a charge pump modifying an amount of charge in a capacitor in response to said comparison signals and a single-input damping circuit outputting a phase-damped signal in response to an amount of voltage from the capacitor, with the capacitor connected to the charge pump and to the damping circuit through a damping resistor, an improvement comprising: p1 connecting the comparison signals from the phase detector directly to a damping circuit having at least three inputs and eliminating the damping resistor.

* * * * *

UNITED STATES PATENT AND TRADEMARK OFFICE
CERTIFICATE OF CORRECTION

PATENT NO. : 5,371,425

DATED : December 6, 1994

INVENTOR(S) : Rogers

It is certified that error appears in the above-identified patent and that said Letters Patent is hereby corrected as shown below:

In column 12, claim 15 at line 31, please delete " control " and insert -- current --.

In column 13, claim 17 at line 7, please delete " Fain " and insert -- gain --.

In column 16, claim 34 at line 39, please delete " p1 " and insert a new paragraph beginning with the word " connecting ".

Signed and Sealed this

Third Day of November, 1998

*Attest:*

BRUCE LEHMAN

*Attesting Officer*  *Commissioner of Patents and Trademarks*